United States Patent [19]

Tjønneland

[11] Patent Number: 5,117,257
[45] Date of Patent: May 26, 1992

[54] CONTACT PRINTER

[75] Inventor: Søren Tjønneland, Sindal, Denmark

[73] Assignee: Eskofot A/S, Ballerup, Denmark

[21] Appl. No.: 521,566

[22] Filed: May 10, 1990

[30] Foreign Application Priority Data

May 18, 1989 [DK] Denmark .................. 2427/89

[51] Int. Cl.⁵ .................................... G03B 27/20
[52] U.S. Cl. ............................... 355/91; 355/93
[58] Field of Search ............... 355/91, 93, 94, 87, 355/73, 76, 118

[56] References Cited

U.S. PATENT DOCUMENTS 1,351,655  3/1920  Johnson ........................ 355/118
3,357,335  12/1967  Blatherwick .................. 255/93
4,526,463  7/1985  Hickey et al. .................. 355/91 X Primary Examiner—L. T. Hix
Assistant Examiner—Khanh Dang
Attorney, Agent, or Firm—Cushman, Darby & Cushman

[57] ABSTRACT

A contact printer for producing graphic material, such as engraving plates, by exposing a metallic surface by means of a light source emitting ultra-violet light. The light source is situated in a box with a lid which can be tipped up. Inside the box, a vacuum frame is provided which can be tipped down from a horizontal position below the lid to an inclined position for the exposure. The resulting apparatus is very compact, and simultaneously, an almost uniform exposure over the entire metallic surface is achieved.

7 Claims, 3 Drawing Sheets

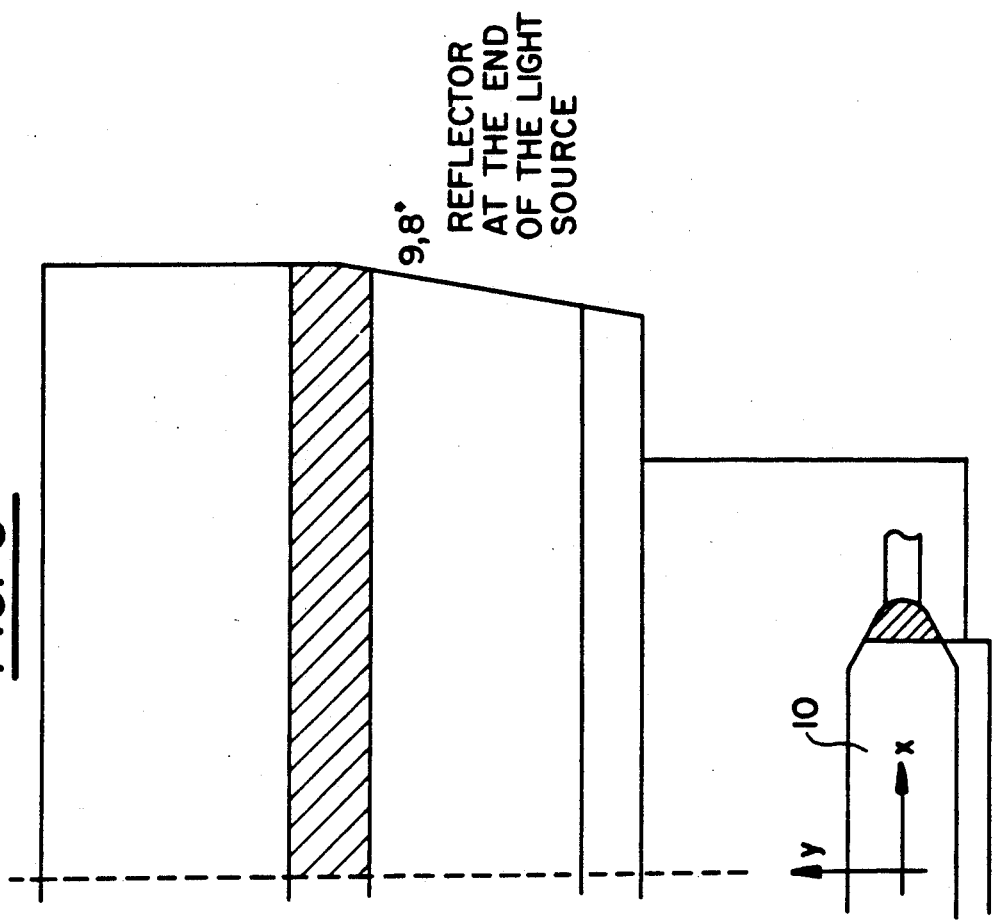
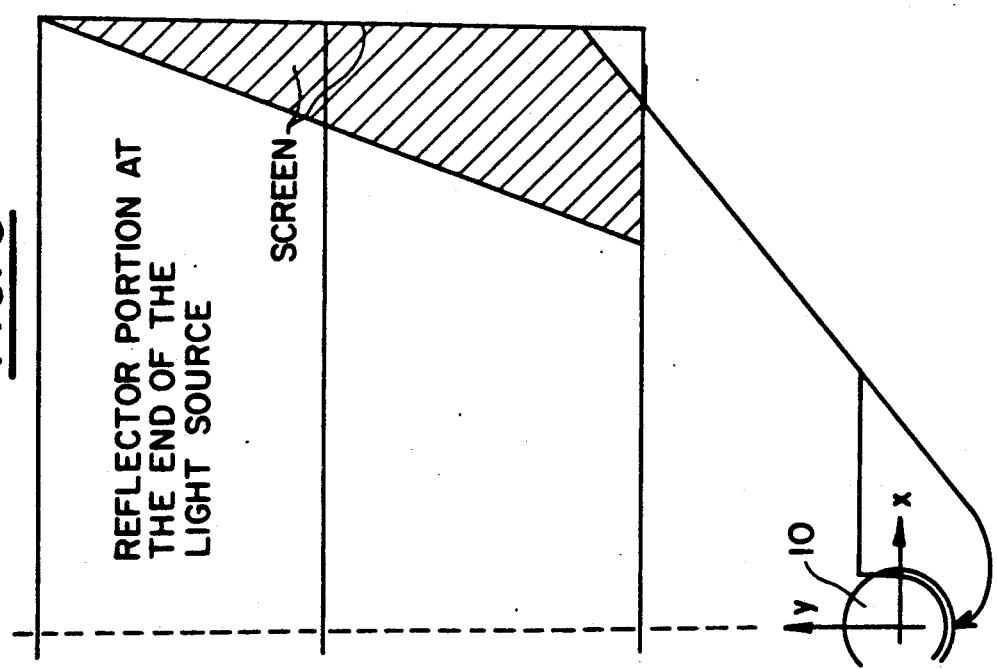

CONTACT PRINTER

FIELD OF THE INVENTION

The invention relates to an apparatus for producing graphic material, such as engraving plates, by exposing light-sensitive material, such as a metallic surface, by means of a light source emitting ultra-violet light.

BACKGROUND ART

An apparatus manufactured by the Eskofot A/S of Bellerup, Denmark allows an exposure of a metal sheet inside a closed box. The metal sheet is placed in a lid and retained by means of vacuum means, whereafter the lid is turned 180° in such a manner that the surface to be exposed faces a light source in the bottom of the box. The distance between the surface and the light source is, however, not sufficiently large for providing a substantially uniform exposure over the entire surface to be exposed. U.S. Pat. No. 3,357,335 discloses a somewhat similar apparatus.

It is also known to suspend the light source in the ceiling and to draw a curtain for the light source during the exposure. The large distance to the light source renders it possible to achieve an almost uniform exposure of the surface to be exposed. Such systems are, however, large and unmangeable, and the large light sources arranged below the ceiling generate much waste resulting in dry air and static electricity.

SUMMARY OF THE INVENTION

The apparatus according to the invention is characterized by the light source being situated in a box with a lid which can be tipped up, whereby a vacuum frame for the material to be exposed is provided in the box. The vacuum frame is capable of being tipped down for the exposure from a horizontal position below the lid into an inclined position. An elongated light source can be arranged in a corner of the box substantially diagonally opposite the vacuum frame and provided with reflectors ensuring a uniform exposure of the inclined vacuum frame. The resulting apparatus is very compact, and simultaneously an almost uniform exposure over the entire surface to be exposed can be achieved.

BRIEF DESCRIPTION OF THE DRAWINGS

The invention is described in greater detail below with reference to the accompanying drawings, in which:

FIG. 5 illustrates the light source with the entire reflector, and FIG. 6 illustrates the light source with a reflector turned 90°.

DESCRIPTION OF PREFERRED EMBODIMENTS

Figure 1:
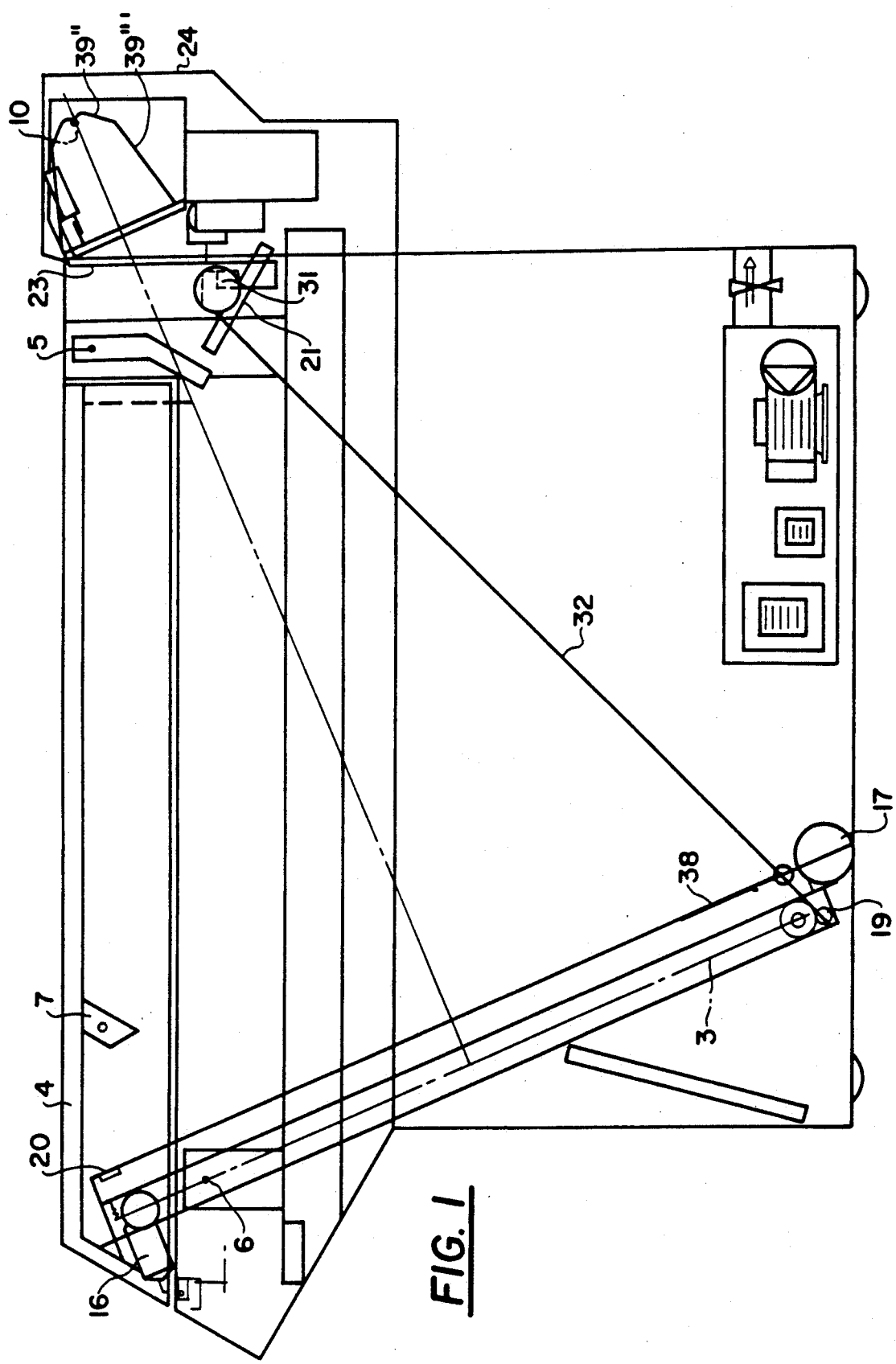
FIG. 1 illustrates a contact printer for the production of engraving plates by exposing a metallic surface mounted on a vacuum frame, which can be tipped down.

The contact printer of FIG. 1 comprises a box containing a light source 10 and a vacuum frame 3, which can be tipped down into an inclined position. The vacuum frame 3 supports the material to be exposed, such as a metallic surface. A lid 4 covering the contact printer has been tipped down. The lid 4 may be turned about an axis 5 of rotation, a locking means being provided in the left side of said lid 4 in connection with a small spring. The lid 4 is furthermore connected to a gas damper 21. When the exposure of the material in the vacuum frame 3 is completed, the vacuum frame 3 is automatically moved upwards into a horizontal position about an axis 6 of rotation. The latter movement is carried out by means of a wire drive and a motor mounted on the support bracket. In other words, a motor with a drum 31 and a wire 32 constitute a means for automatically raising the vacuum frame 3 from its lowered position (shown in full lines in FIG. 1), to a raised position in which the vacuum frame 3 is disposed generally horizontally relative to the bottom of the generally rectangular box housing the contact printer, after the surface of the light-sensitive material 37, while loaded on the vacuum frame 3, has been exposed to the light source 10. For the sake of security, the vacuum frame 3 is moved upwards into a horizontal position before the lid 4 swings up. When the vacuum frame 3 is in the horizontal position, the lid 4 swings up. Corresponding safety measures are taken when the lid 4 is being closed. The frame 3 is not moved downwards into the inclined position until the lid 4 is closed. An auxiliary light 7 in the form of a plurality of fluorescent tubes is arranged on the inner side of the lid 4. When the lid 4 swings up, the auxiliary light 7 is vertical and illuminates the glass plate of the vacuum frame 3 in such a manner that it is easy to position the material to be exposed, such as sheets and offset plates, in a correct manner. The vacuum frame 3 is moved by means of the above mentioned motor.

Figure 3:
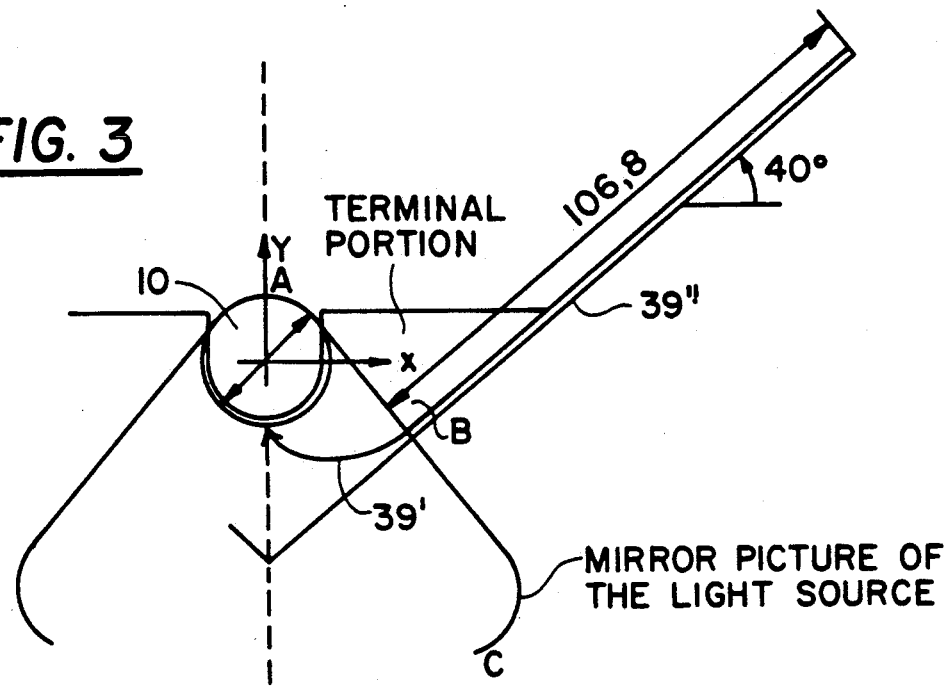
FIG. 3 illustrates the light source with a reflector formed like an unwinder curve.

The light source 10 emitting ultra-violet light and the associated reflectors 39', 39" and 39''' are arranged to the right, cf. FIG. 1 and FIG. 3. A light stop is situated in front of the light source 10. Filters 23 may be inserted in the light path in front of the light source 10. The insertion of the filter 23 is controlled by means of a further motor 9 with a worm drive. The light source 10 and the reflectors 39', 39" and 39''' associated therewith are built into a box 24. Air enters through the reflector opening and passes the light source 10 and continues downwards towards the floor through a hose. A plurality of choke coils may be inserted in series with the ultra-violet lamp 10 in response to the desired effect.

Figure 2:
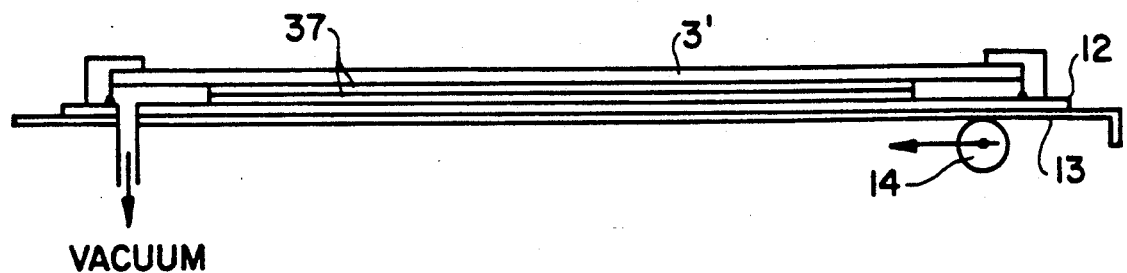
FIG. 2 illustrates the vacuum frame.

The vacuum frame 3 of FIG. 2 carries the sheet and comprises a glass plate 3' and a vacuum system with a rubber cover 12. An adjustment plate 13 is situated below the rubber cover 12. A squeeze roller 14 is situated below the adjustment plate 13, this squeeze roller 14 squeezing out the air between the layers 37 of sheet in a quick and efficient manner. The adjustment plate 13 between the squeeze roller 14 and the cover 12 implies that the roller 14 does not press the sheets 37 in a too concentrated manner, which might otherwise cause a displacement of said members relative to the cover. Without the adjustment plate 13, the rubber cover 12 might be moved. As a result, the sheets 37 can be displaced and cannot therefore be in register relative to one another. In addition, the squeezing force of the roller 14 is adjusted over a large area of the sheets in such a manner that the specific pressure is reduced. A motor 16 with a worm is situated at the end of the vacuum frame 3, this motor reciprocating the squeezing roller 14. The squeezing roller 14 is reciprocated through a chain drive. The chain extends about a sprocket wheel 19. A light-scattering sheet or a stray-light sheet 38 can be placed in front of the vacuum frame 3 by means of a second motor 17 in order to provide a diffuse light on the sheets 37. The light-scattering sheet 38 can be situated in front of the glass plate of the vacuum frame 3 and is wound about a roller in front of the motor 17. As indicated, the sheet 38 is on its way out. A black dot indicates a carrier bar, the light-scattering sheet 38 being secured to said carrier bar. The carrier bar is driven by means of a cord drive, the cord extending around a wheel 20 at the opposite end of the frame 3 parallel thereto. Thus, the light-scattering sheet 38 is secured to the frame 3, which can be tipped.

The frame 3 is mounted to a mounting means 7 in the upper portion of the apparatus and is suspended in spherical bearings for rotation about the point 6. The frame 3 may be of a width of about 1.2 m. The frame 3 has in FIG. 1 been turned 69° relative to the horizontal plane.

Figure 4:
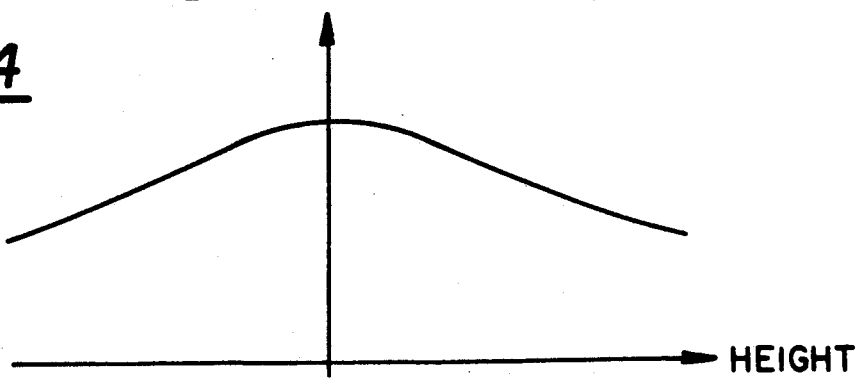
FIG. 4 illustrates the associated distribution of light.

FIG. 3 illustrates the elongated cylindrical light source 10 and a portion of the associated reflector 39. It is of major importance that the elongated cylindrical light source 10 be substantially horizontally arranged in order to ensure a uniform distribution of the temperature. A further object is to ensure a uniform exposure of the surface to be exposed. For the latter purpose, the reflector 39 of the light source 10 has been shaped in a particular manner. The light source 10 is first of all provided with a reflector 39' formed like an unwinder curve and ensuring that the emitted light corresponds to the light emitted by a light source of a predetermined width. Subsequently, the light source with the unwinder reflector 39' may be equalized with an imaginary light source of a predetermined width, cf. curve AB of FIG. 3. The imaginary light source of a predetermined width is subsequently reflected into a plane reflector portion 39" in such a manner that the reflection of said first-mentioned imaginary light source of a predetermined width also appears. In this manner, an imaginary light source of twice the width appears, cf. curve ABC of FIG. 3. Such a light source provides an exposure substantially as illustrated in FIG. 4. The exposure is strongest in the middle. In order to achieve a more uniform exposure, an additional plane reflector portion 39''', cf. FIG. 1, is added, this additional portion 39''' amplifying the exposure along the rim of the surface to be exposed.

FIG. 6 illustrates the terminal reflectors.

Thus, the invention provides a contact printer of a low height, in which the ultra-violet light has been completely screened by the lid 4 during the exposure. The heat-generating reflector system appears as an encased unit at a height at which a ventilating system can be easily connected.

A motor with a drum 31 for the winding of a wire 32 is placed behind the gas damper 21. The wire 32 extends downwards about the back of the frame 3. The wire 32 can slide on the frame 3 and is secured to the bracket adjacent the motor. In this manner, the motor with the drum 31 is capable of tipping up the frame 3 into the horizontal position.

I claim:

1. An apparatus for producing graphic material by exposing a surface of a light-sensitive material to ultra-violet light, comprising:
   an upright box having a body and a lid which is movably associated with the body for movement between an open position in which a cavity defined by the box is open for access from externally of the box, and a closed position in which the cavity is isolated from externally of the box;
   a source of ultra-violet light disposed in the box cavity;
   a vacuum frame for holding light sensitive material for exposure to ultra-violet light in the box cavity, said vacuum frame being disposed in said box cavity; and
   means mounting said vacuum frame to said box for movement between a raised position for loading and unloading, in which said vacuum frame is disposed generally horizontally, below said lid when said lid is in said closed position thereof, and a lowered position, in which said vacuum frame is inclined relative to horizontal for presenting light sensitive material, when loaded thereon, towards said source of ultra-violet light for exposure of said surface.

2. The apparatus of claim 1, wherein:
   said box is of generally rectangular shape so as to have a lower transversally horizontally extending corner which is diagonally opposite an upper transversally horizontally extending corner;
   said light source being located in said upper corner, backed by reflectors and being directed at a site part way up said box body, above said lower corner; and
   said vacuum frame, when in said lowered position, being generally centered, heightwise, on said site.

3. The apparatus of claim 2, wherein:
   said light source is elongated transversally of said box, as are said reflectors.

4. The apparatus of claim 1, further including:
   means for automatically raising said vacuum frame from said lowered position to said raised position after said surface of said light-sensitive material, while loaded on said vacuum frame, has been exposed to said light source.

5. An apparatus as in claim 1, wherein:
   an adjustment plate with a squeeze roller is arranged below a rubber cover in the vacuum frame, said squeeze roller squeezing out air;
   a worm arranged at one end of said vacuum frame, said worm reciprocating said squeeze roller by means of a chain drive.

6. An apparatus as in claim 3, wherein the elongated light source is substantially horizontally arranged relative to said box, in order to obtain a uniform temperature of the light source.

7. An apparatus as in claim 2; wherein the reflectors are formed with substantially unwinder curvature.

* * * * *